United States Patent [19]

Sharp

[11] Patent Number: 5,257,236
[45] Date of Patent: Oct. 26, 1993

[54] STATIC RAM

[75] Inventor: P. Owen Sharp, Aptos, Calif.

[73] Assignee: Silicon Engineering, Inc., Scotts Valley, Calif.

[21] Appl. No.: 738,921

[22] Filed: Aug. 1, 1991

[51] Int. Cl.$^5$ .............................................. G11C 7/00
[52] U.S. Cl. ............................ 365/230.05; 365/189.04
[58] Field of Search ............... 365/189.04, 230.05; 395/425

[56] References Cited

U.S. PATENT DOCUMENTS

| | | | |
|---|---|---|---|
| 4,817,054 | 3/1989 | Banerjee et al. | |
| 4,829,471 | 5/1989 | Banerjee et al. | |
| 4,870,621 | 9/1989 | Nakada | 365/230.05 |
| 4,933,909 | 6/1990 | Cushing et al. | 365/230.05 |
| 4,954,987 | 9/1990 | Auvinen et al. | |
| 4,975,872 | 12/1990 | Zaiki | 365/230.05 |
| 5,062,081 | 10/1991 | Rudaldue | 365/230.05 |

OTHER PUBLICATIONS

Functional Simulator for Memory Device, IBM Technical Brochure, vol. 30, No. 5, Oct. 1987.

Primary Examiner—Eugene R. LaRoche
Assistant Examiner—Son Dinh
Attorney, Agent, or Firm—Blakely, Sokoloff, Taylor & Zafman

[57] ABSTRACT

An improved static memory is described which, when used in a dual port cache memory simplifies write cycles by providing latching of decoded address signals which are used in a subsequent memory cycle for writing. Improved logic is described which allows the propagation of data at the rate $f$ with timing signals of frequency $\frac{1}{2}f$. An improved sense amplifier which is isolated from the column lines is the array is used.

10 Claims, 4 Drawing Sheets

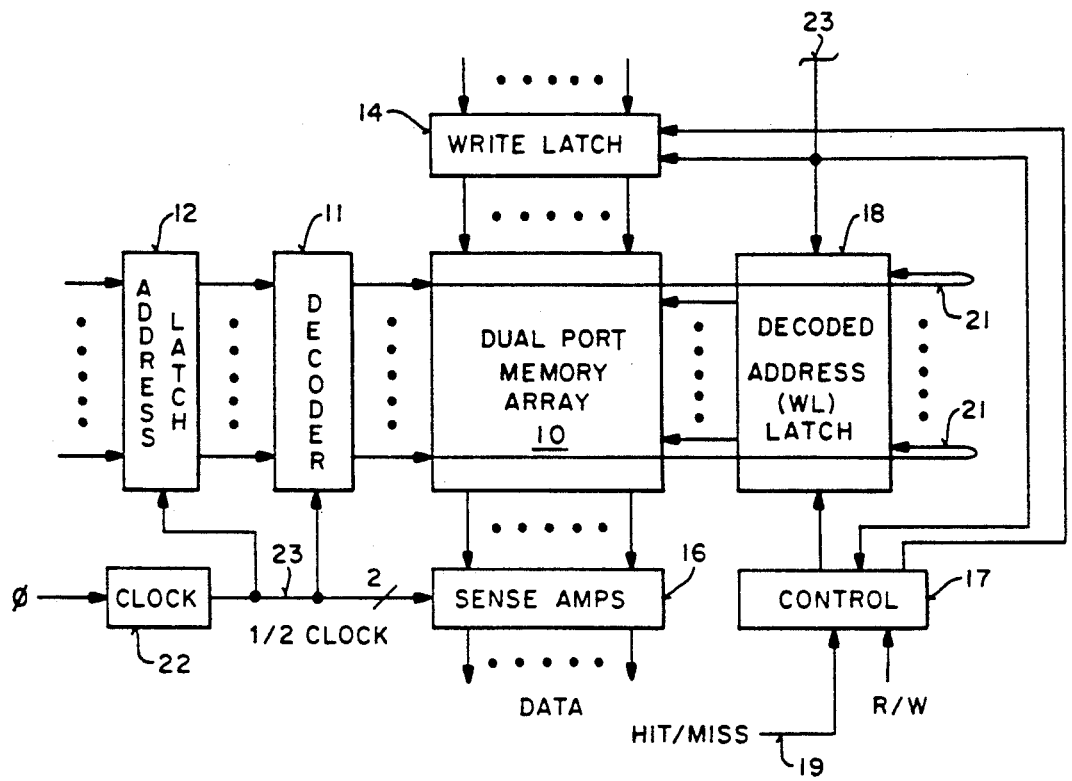
FIG_1
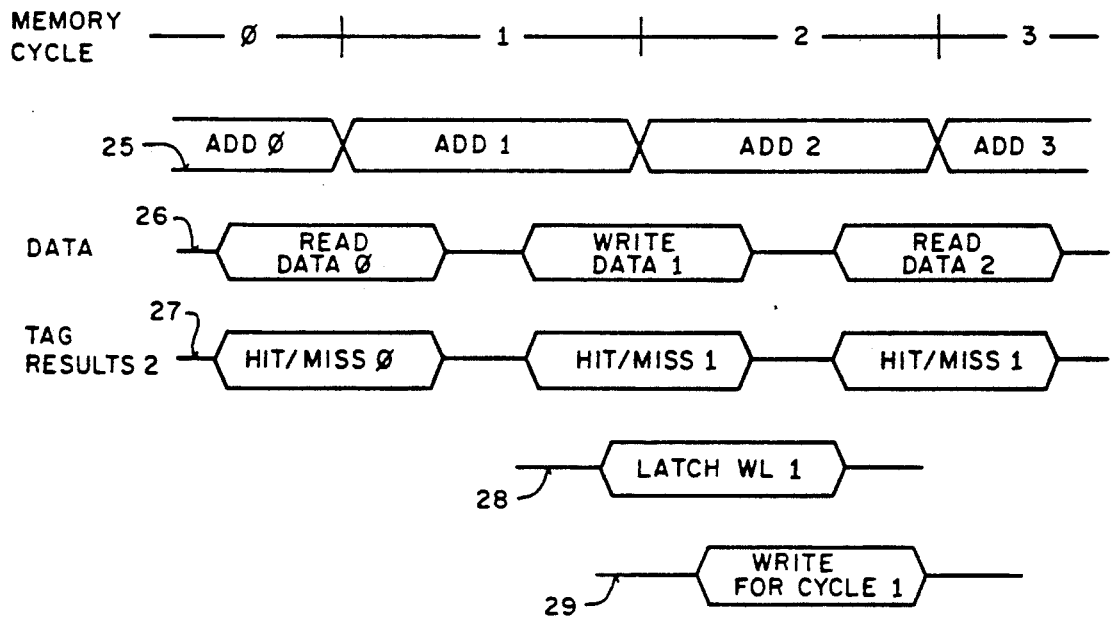
FIG_2

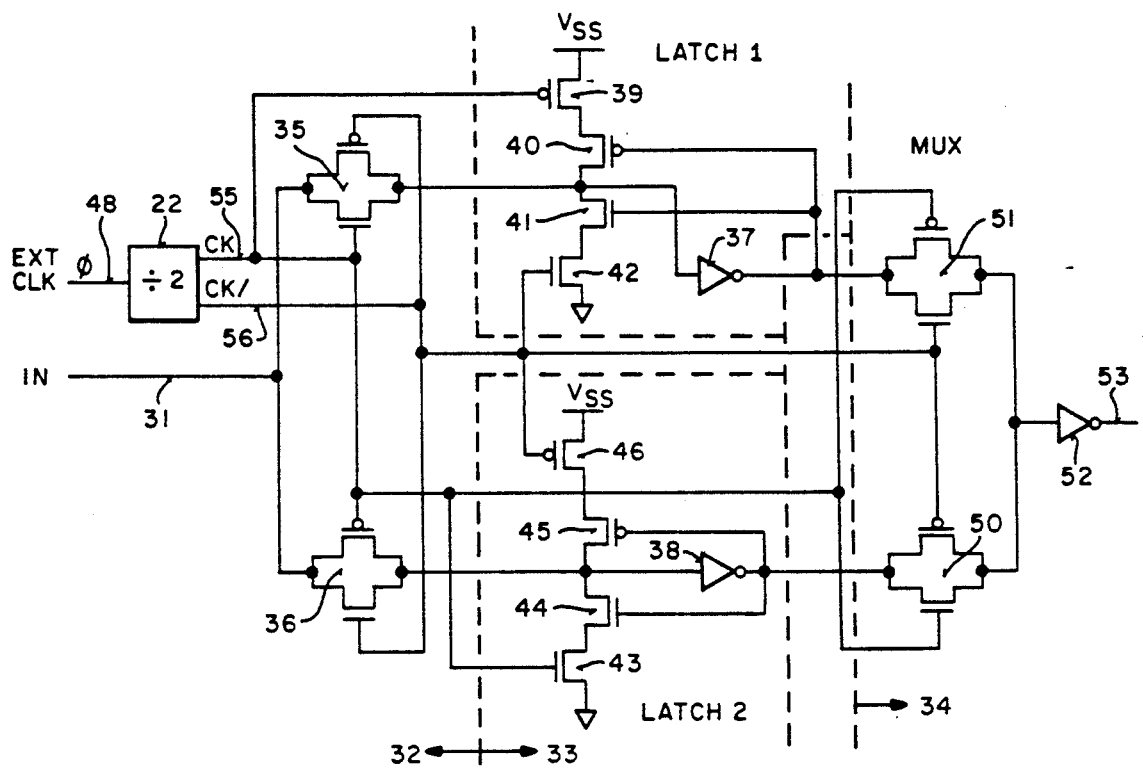
FIG_3
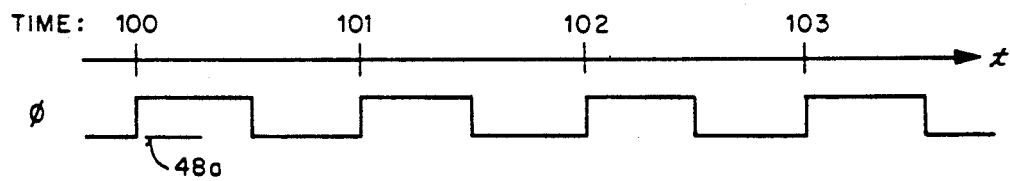
FIG_4
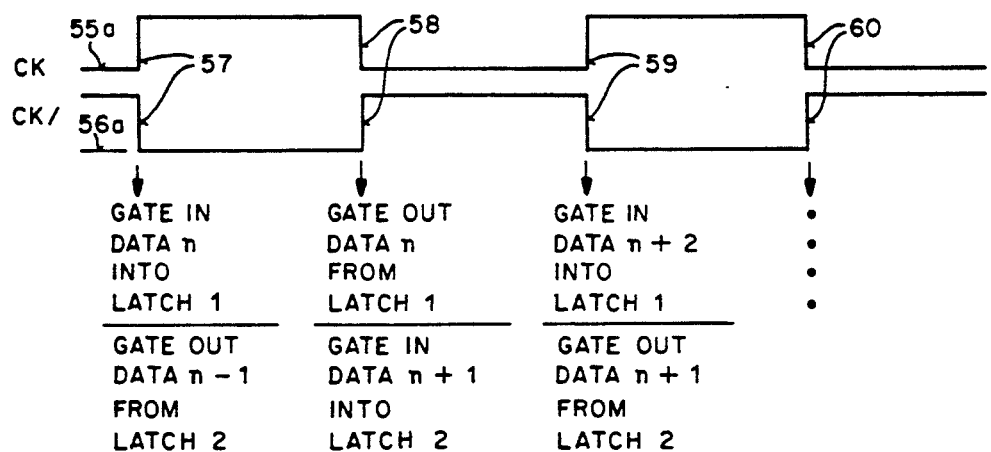

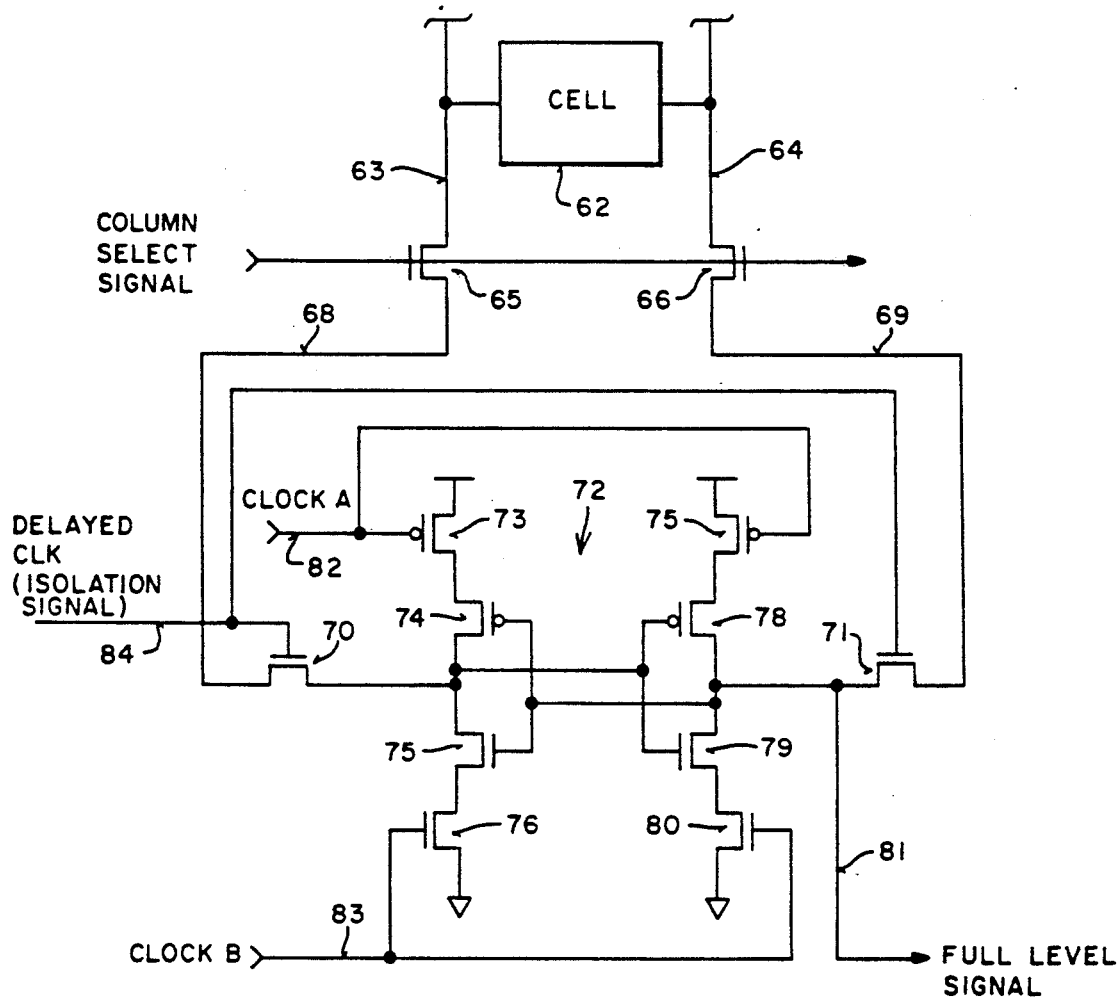
FIG_5
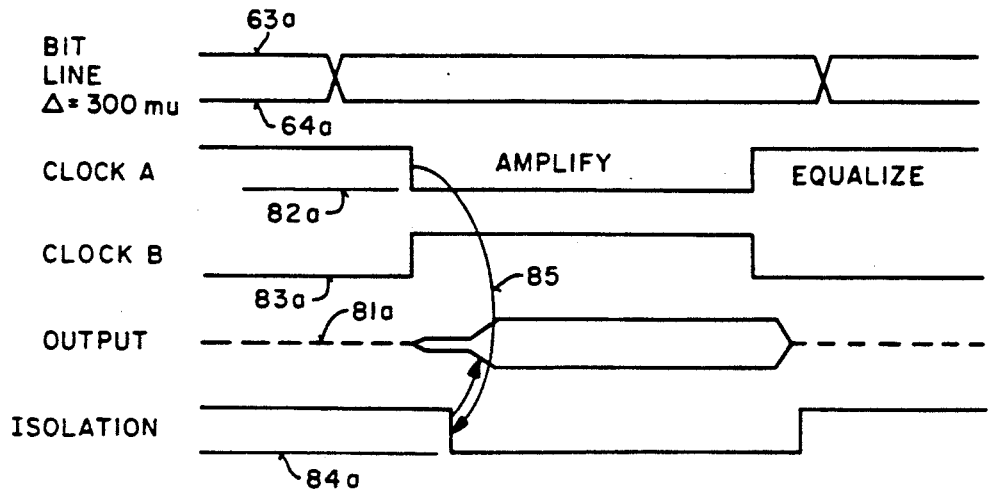
FIG_6

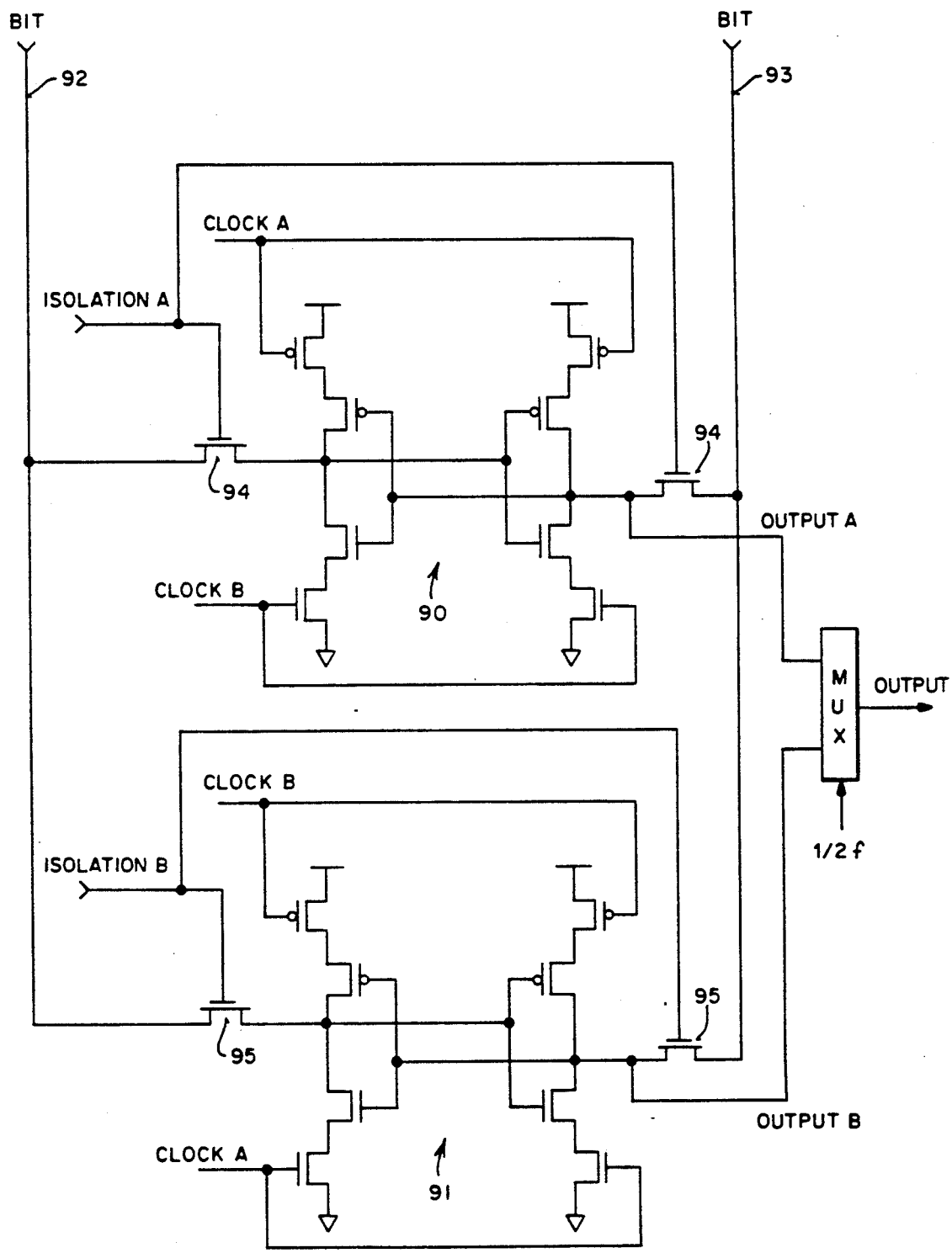
FIG_7

ID
STATIC RAM

FIELD OF THE INVENTION

1. Background of the Invention

The invention relates to static RAMs, particularly RAMs used in cache memories and dual port RAMs used for color pallets.

2. Prior Art

Static memory cells employing bistable, flip-flop memory cells are well-known in the art. In some cases, these memories are used as part of cache memories for storing tags and data. Static memory cells are also used which have dual ports; that is, two complementary pairs of read/write lines are included in the array for each cell along with selecting means to permit either pair of read/write lines to be selected. These dual port cells are used in applications such as color pallets (sometimes referred to as color look-up tables); for color pallets it is desirable to asynchronously access the ports. A dual port memory cell is disclosed in U.S. Pat. No. 4,823,314.

The present invention discloses a static memory array, and more particularly, the peripheral circuits associated with the array. An arrangement is described which permits improved writing into a dual port array. As will be seen, the present invention allows "write-later" with a minimum of additional circuitry.

Often in integrated circuits where data is transferred on the chip at a frequency $f$, a clocking signal of frequency $f$ is distributed throughout the circuit to "clock" the logic. The clocking signal is coupled to various logic circuits, such as latches, to permit the serial transferring of data in a noninterferring manner throughout the chip. As the frequency $f$ becomes higher, it becomes more different to distribute this clocking signal throughout the chip. As will be seen with the present invention, the need for a clocking signal of frequency $f$ is eliminated, and rather a signal of $\frac{1}{2}f$ is used.

Additionally, the present invention discloses a sense amplifier for use with static cells. Sense amplifiers are well-known in the prior art. The closest known sense amplifier to the one of the present invention is described in U.S. Pat. No. 4,905,189 (FIGS. 7 and 8). There, isolation is provided between the amplifier's input and output. As will be seen with the present invention, isolation is provided between the column lines in the array and the sense amplifier, thereby removing a substantial load from the amplifier permitting faster sensing. Other prior art known to the Applicant is U.S. Pat. No. 4,223,394 which describes a sense amplifier in an EPROM array where the column lines are held to narrow voltage swings.

SUMMARY OF THE INVENTION

In a dual port memory array have first and second data ports, and first and second access lines, an improvement is disclosed which makes it easier to write into the array. A decoder means selects first access lines in the array in response to an address. The output of the decoder is coupled to a latch with the output of the latch being coupled to the second select lines in the array. Under predetermined conditions, the decoding done by the decoder is used both by the first select lines and the second select lines. For instance, if the dual port memory array is used in a cache, the array can be accessed through the first port in an ordinary manner for reading; if a "hit" occurs during a write cycle, the decoded address signals are subsequently used (e.g., during the next memory cycle) through the latch for writing into the array through the second port. (Typically, there is insufficient time in a single cycle to write data into the array after a hit is detected.)

The present invention also describes unique logic which permits the propagation of serial data at a frequency $f$ using a timing signal of frequency $\frac{1}{2}f$. Toggled latches are used which operate on both the rising and falling edge of the clocking signal $\frac{1}{2}f$.

Additionally, a sense amplifier is disclosed which employs a latch and means for isolating the latch from the column lines in the array.

BRIEF DESCRIPTION OF THE DRAWINGS

FIG. 1 is a block diagram illustrating the use of the present invention in a dual port memory array.

FIG. 2 illustrates a plurality of waveforms used to describe the operation of the memory of FIG. 1.

FIG. 3 is an electrical schematic of the invented logic for transferring data at frequency $f$ using a clocking signal of frequency $\frac{1}{2}f$.

FIG. 4 illustrates clocking signals used to describe the operation of the circuit of FIG. 3.

FIG. 5 is an electrical schematic of the sense amplifier of the present invention and its coupling to a memory cell in an array.

FIG. 6 illustrates the plurality of waveforms used to describe the operation of the circuit of FIG. 5.

FIG. 7 is an electrical schematic of the currently preferred embodiment of the invented sense amplifier.

DETAILED DESCRIPTION OF THE PRESENT INVENTION

Improvements in a static random-access memory (RAM) are described. In the following description, numerous specific details are set forth, such as specific conductivity type transistors, in order to provide a thorough understanding of the present invention. It will be obvious, however, to one skilled in the art that the present invention may be practiced without these specific details. In other instances, well-known circuits have been shown in block diagram form and other well-known circuits have not been set forth in detail in order not to obscure the present invention.

Referring now to FIG. 1, a memory array 10 is illustrated which may comprise a plurality of known dual port static memory cells, for example, those having eight transistors per cell and using a bistable (flip-flop) circuit. For the illustrated embodiment, one port of the memory is selected by the word lines at the output of the decoder 11. Accessing through these word lines provides a "read" output to the sense amplifiers 16 which are coupled to a data bus. For the illustrated embodiment, the second port of the memory is accessed again through a plurality of word lines coupled to the array from the output of the latch 18. These word lines select cells to permit writing of data into the array 10 with the data being written from the write latch 14. While the illustrated embodiment uses one port for writing and one port for reading, both ports may be used for either reading or writing in some applications.

With the present invention the addresses are coupled through an address latch 12 and then under the control of a clocking signal are shifted to the decoder 11 where they are decoded. A specific word line is selected in the array 10 corresponding to the applied address allowing the data to be sensed by the sense amplifiers 16. With the present invention, the output of the decoder 11, in addition to selecting a word line in the array for the first port, is coupled to the decoded address latch 18. Hence, the output of decoder 11 is stored in latch 18. The information stored in the latch 18 represents the selected word line corresponding to the input address. As will be seen, this latched information is used in a subsequent memory cycle to allow data to be written into the array 10 from the write latch 14. Data intended to be written into the array 10 is coupled to the write latch 14 from the data bus.

As will be discussed in conjunction with FIG. 3, the input timing signal $\phi$ is coupled to a clock circuit (divider) 22. The output of this circuit is a timing or clocking signal (and its complement) of one-half the frequency of the input timing signal. These signals on lines 23 are coupled to the address latch, sense amplifiers 16, control circuit 17, latch 18 and write latch 14. The waveforms of the signals at the input and output of the clock circuit 22 are shown in FIG. 4.

The control circuit 17 provides control signals particularly for the latches 14 and 18 for the described embodiment. Where the memory is used as part of a cache, a signal is communicated to the circuit 17 on line 19 indicating whether a hit or a miss has occurred. Also, a read/write signal is communicated to circuit 17. As will be seen, the control circuit 17 enables writing into the array 10 using the latched word line information from the latch 18 and the data from latch 14. Circuit 17 may be ordinary logic gates used to implement the described function.

Referring to FIG. 2, line 25 illustrates sequential memory addresses for read and write cycles for memory cycles 0, 1, 2 and 3. These addresses are coupled to the latch 12. The line 26 illustrates data on the data bus. For memory cycle 0, data is read from the memory array 10 onto the data bus as the address signals are decoded and select cells for the first port; the read data is shown on line 26. Memory cycle 1 is a write cycle and the write data is shown on line 26. This data is coupled into the write latch 14. The memory cycle 2 is again a read cycle.

When the memory array is used as part of a cache memory, a hit or miss condition is detected as is well known and such conditions are shown on line 27 of FIG. 2. The hit or miss is detected somewhat late in the memory cycle. For read cycles, this late detection of the memory cycle presents no problem since, for example, as shown for memory cycle 0, the data is immediately read from the array 10 (before the hit or miss is detected) and is either accepted or rejected based on whether a hit or miss condition is detected. Accordingly, as illustrated for memory cycle 0 the data is available towards the end of memory cycle 0. This is also true for memory cycle 2.

A problem arises for write cycles. For memory cycle 1, a write cycle, the hit or miss condition is again not detected until near the end of the memory cycle. Assume the data is to be written into the array 10 when a hit occurs; there is generally insufficient time to write data 1 into the array 10 after the hit is detected and before memory cycle 2 begins. With the present invention, for a write cycle where a hit condition is detected, the decoded word line information from the decoder 11 is coupled into the latch 18 and stored. As illustrated on line 28, this occurs towards the end of memory cycle 1 when the address for cycle 1 is still in latch 12. Then during memory 2, the write data from latch 14 is written into array 10 under control of a signal from circuit 17 with cells being selected by the word line information stored within latch 18. This write cycle, shown on line 29, occurs through the second port of the array. In this manner, the write cycle is basically transparent to the user. Note that the write cycle may occur at the same time as a subsequent read cycle. In the event that the subsequent read cycle is reading the very data being written into the array, the writing process being somewhat stronger than the reading process, the new data is read.

While in the preferred embodiment the output of the decoder 11 is shown coupled to a latch 18, instead of this, a second address latch may be used to latch the addresses and a second decoder used to decode these addresses to select the second port of the memory. This makes the circuit more complicated, however, it provides the advantage that the second port can be used more independently.

In FIG. 3 a circuit is illustrated which may be used for latches or other logic circuits. The memory of FIG. 1 may be realized without this circuit and conversely, the circuit may be used in other than the memory of FIG. 1.

Referring to FIG. 3, the externally applied clocking signal $\phi$ is shown on line 48 coupled to the clock circuit 22. In the currently preferred embodiment, circuit 22 is a divide-by-two circuit. The outputs of circuit 22 are complementary clocking signals on lines 55 and 56. The external and internal clocking signals are shown in FIG. 4. In FIG. 4 the letter "a" is used to indicate the signal waveform of the corresponding numbered line. Thus, waveform 48a of FIG. 4 represents the signal on line 48.

Sequential data is applied to line 31 and is clocked through the circuit of FIG. 3 under the control of the clocking signals with an output being provided on line 53.

The circuit of FIG. 3 permits the data to be moved from line 31 to line 53 at a frequency $f$ assuming that $f$ is the frequency of the externally applied clocking signal. Importantly, the internal clocking signal on lines 55 and 56 is $\frac{1}{2}f$ as seen in FIG. 4. This provides the advantage of clocking data at the frequency $f$ with a clocking signal $\frac{1}{2}f$. Note in a typical integrated circuit, the clocking signal is distributed throughout the chip and its propagation is sometimes difficult since it must be twice as fast as the data signal and more widely distributed.

In the circuit of FIG. 3 the input data from line 31 is alternately transferred into latches 1 and 2 and alternately removed from the latches onto line 53. The data is in effect demultiplexed through transistors 35 and 36 into the latches. Transistors 35 comprise an n-channel and p-channel transistor coupled in parallel and similarly, transistors 36 comprise an n-channel and p-channel transistor coupled in parallel. The gate of the n-channel transistor of transistor 35 is coupled to line 55 with the n-channel transistor of transistors 36 being coupled to line 56. The p-channel transistor of transistors 35 is coupled to line 56 and the p-channel transistor of transistors 36 is coupled to line 55.

Latch 1 comprises the inverter 37 and a second inverter comprising transistors 39, 40, 41 and 42. These inverters are coupled to one another in a standard configuration to provide a latch. Similarly, latch 2 includes the inverter 38 and a second inverter comprising transistors 43, 44, 45 and 46. The inverter comprising transistors 39 through 42 is powered down to assure that a signal transferred to latch 1 from transistors 35 overpowers the state of the latch then existing so that the new data is transferred into the latch. Likewise the inverter comprising transistors 43 through 46 is powered down to assure that the incoming data from transistors 36 is latched within latch 2. In latch 1 the p-channel transistor 40 and n-channel 41 receive the feedback signal from the output of the inverter 37. And in a like manner, the n-channel transistor 44 and p-channel transistor 45 receive the feedback signal from the output of the inverter 38. The n-channel transistor 42 of latch 1 is coupled to line 56, the corresponding transistor 43 of latch 2 is coupled to line 55. The p-channel transistor 39 of latch 1 is coupled to line 55 and in contrast, the p-channel transistor 46 of latch 2 is coupled to line 56.

The output of latches 1 and 2 are coupled to a multiplexer comprising transistors 50 and 51. The output of this multiplexer is coupled to the input of an inverter 52 and the output of this inverter provides the output signal on line 53. The p-channel transistor of transistors 51 and the n-channel transistor of transistors 50 are coupled to line 55; and, the p-channel transistor of transistors 50 and the n-channel transistor of transistors 51 is coupled to line 56.

Transistors 35 and 50 are synchronized by these timing signals as are transistors 36 and 51. Transistors 35 and 50 transfer data out of phase with the data transferred by transistors 36 and 51. Similarly, latch 1 and latch 2 operate out of phase with one another.

Referring now to FIG. 4, the internal clocking signal is shown on lines 55a and 56a. Note data is transferred both on the leading and the falling edges of the clocking signal. Edges 57 occur at time 100, at which time data n is passed through transistors 35 into latch 1. The rising edge on line 55a and the falling edge on line 56a causes transistors 35 to conduct while transistors 37 are off. During this time, transistors 39 and 42 of latch 1 do not conduct allowing the input signal from line 31 to be transferred through transistors 35 and to establish the correct output from inverter 37. At time 101, following edges 58, transistors 35 do not conduct and transistors 51 conduct. Latch 1 is set once these edges occur since transistors 39 and 42 are conducting. This permits a signal to pass through transistors 51 onto line 53. During this period, transistors 36 conduct allowing a signal to pass to inverter 38. Transistors 50 do not conduct following time 101 and hence the output of inverter 38 does not interfere with the signal being transferred from latch 1. At time 102 at edge 59, the data from latch 2 is transferred through transistors 50 onto line 53 and the new data is transferred from line 31 into latch 1. Thus, as can be seen from the above description, the incoming data is toggled between latch 1 and latch 2, and out of phase with this, data is toggled out from latch 1 and latch 2 onto line 53. Importantly, this can be done as shown with a clocking signal having a frequency one-half that of the data rate.

FIG. 5 illustrate one of the sense amplifiers of sense amplifiers 16 of FIG. 1. As will be seen in connection with FIG. 7, the amplifiers are used in pairs in the currently preferred embodiment. A pair of complementary column lines 63 and 64 are illustrated coupled to a memory cell 62. Other cells along the column are not illustrated. Also, only a single pair of column lines are shown coupled to the cell 62. Where a dual port cell is used another pair of column lines are coupled to the cell; and, for the embodiment of FIG. 1 these other column lines are coupled to a write amplifier through select transistors. The column lines 63 and 64 are coupled to the sense amplifier through a pair of select transistors 65 and 66. These transistors receive the column select signal as is commonly used.

The sense amplifier includes cross coupled branches which operate as a latch. Initially when the circuit is activated the bistable circuit is in an unstable state; potentials on lines 68 and 69 cause the latch to set in one of its two stable states. One branch of the circuit comprises transistors 73, 74, 75 and 76 coupled in series; transistors 73 and 74 are p-channel transistors. The other branch comprises transistors 77, 78, 79 and 80; transistors 77 and 78 are p-channel transistors. The input to the latch from line 68 is coupled through transistor 70 to the common junction between transistors 74 and 75 and to the gates of transistors 78 and 79. Similarly, line 69 is coupled through transistor 71 to the common junction between transistors 78 and 79 and to the gates of transistors 74 and 75. Transistors 76 and 80 receive a signal on line 83 identified as "Clock B". The gates of transistors 73 and 77 are coupled to line 82 and receive the signal "Clock A". The signals on lines 82 and 83 are shown in FIG. 6 as waveforms 82a and 83a, respectively. The output from the latch is taken on line 81; this output provides a full level signal.

Referring to FIG. 6, the voltage swing on the column lines 63 and 64 are shown as waveform 63a and 64a. Typically, this voltage is approximately 300 millivolts. It is this potential that is sensed, amplified and coupled to line 81. Once a cell has been selected and the transistors 65 and 66 activated, the Clock A signal drops in potential and the Clock B signal rises in potential. This activates the latch. Importantly, lines 63 and 64 are decoupled from the latch after initial sensing occurs through use of another signal. This signal on line 84 is coupled to the gates of the n-channel transistors 70 and 71. As shown in FIG. 6, as waveform 84a, this signal drops in potential after the latch is initially activated as shown by line 85. Once waveform 84a drops in potential, transistors 70 and 71 cease to conduct thereby isolating lines 63 and 64 from the latch.

What is occurring, is that the voltage differential on lines 63 and 64 is initially used to begin to set the latch in its proper state. Once this process begins, transistors 70 and 71 cease to conduct thereby isolating the column lines along with their high capacitance from the latch. In effect, the latch is unloaded and thereby able to set in one of its two stable states more quickly since it is not driving the column lines.

In FIG. 5, separate transistors are illustrated for selecting columns and for providing the isolation. In some embodiments, it may be desirable to combine for instance, the functions of transistors 65 and 70 so that a single transistor provides both the select function with appropriate timing to provide the isolation to allow the latch to more quickly set.

In the currently preferred embodiment, a single bit line pair is multiplexed to feed into a pair of the sense amplifiers. The circuit of FIG. 3 is used with its $\frac{1}{2}f$ clocking except that the sense amplifier of FIG. 5 are the "latches". Also for this application, a signal is taken in at transistor 50 and 51, instead of providing an output.

This is shown in FIG. 7 where bit lines 92 and 93 are multiplexed by the isolation signals through transistors 94 and 95 into sense amplifiers 90 and 91, respectively. The principles discussed for the timing diagram of FIG. 6 apply to FIG. 7. For FIG. 7 there are two isolation signals which are complements of one another; Clock A and Clock B are synchronized with the ½f clock.

Thus, an improved static memory has been described particularly useful in cache memories and color pallets.

I claim:

1. A memory apparatus comprising:

a dual port memory array having first and second data ports, and first and second select lines;

address decoder means for decoding address signals and for providing decoded address signals, said decoded address signals being coupled to said first select lines; and, circuit means coupled to said second select lines for selectively providing said decoded address signals from said address decoder means, to said second select lines to access said memory array upon occurrence of a predetermined event.

2. The apparatus defined by claim 1 wherein said decoded address signals applied to said first select lines during a memory cycle n are applied to said second select lines during a memory cycle n+1.

3. The apparatus defined by claims 1 or 2 wherein said memory array is part of a cache memory and wherein said predetermined event is a hit condition in said cache memory during a write cycle.

4. The apparatus defined by claim 3 wherein data to be written into said array is latched at said second ports.

5. A memory apparatus comprising:

a dual port memory array having first and second data ports and first and second select lines;

address decoder means for decoding address signals and for providing decoded address signals, said decoded address signals being coupled to said first select lines for accessing said array at said first port; and, a first latch coupled to said address decoder means for receiving and latching said decoded address signals, said first latch coupled to said second select lines for accessing said array at said second port.

6. The apparatus defined by claim 5 including a second latch coupled to said second port, for storing data to be written into cells in said array selected by said second select lines.

7. The apparatus defined by claim 6 wherein said decoded address signals in said first latch select cells in said array on said second select lines upon occurrence of a predetermined event.

8. The apparatus defined by claim 7 wherein upon occurrence of said predetermined event, said decoded address signal from a memory cycle n select cells in said array on said second select lines during the memory cycle (n+1).

9. The apparatus defined by claims 5 or 7 wherein said decoded address signals represented selected word lines in said array.

10. A memory apparatus comprising:

a dual port memory array having first and second data ports and first and second select lines;

an address decoder for decoding address signals and for providing decoded address signals, said decoded address signals being coupled to said first select lines for accessing said memory array through said first data port; and, a first latch coupled to said address decoder for receiving and latching said decoded address signals, said first latch coupled to said second select lines for permitting said decoded address signals from said address decoder to selectively access said memory array through said second data port.

* * * * *